(12) United States Patent
Miyadera

(10) Patent No.: US 6,909,231 B2
(45) Date of Patent: Jun. 21, 2005

(54) LIGHT EMITTING DEVICE HAVING A LIGHT EMITTING LAYER COMPOSED OF A MATERIAL CONTAINING A POLYMER

(75) Inventor: Toshiyuki Miyadera, Saitama-Ken (JP)

(73) Assignee: Pioneer Corporation, Tokyo (JP)

(*) Notice: Subject to any disclaimer, the term of this patent is extended or adjusted under 35 U.S.C. 154(b) by 0 days.

(21) Appl. No.: 10/665,493

(22) Filed: Sep. 22, 2003

(65) Prior Publication Data
US 2004/0100186 A1 May 27, 2004

Related U.S. Application Data

(62) Division of application No. 09/799,000, filed on Mar. 6, 2001, now Pat. No. 6,656,656.

(30) Foreign Application Priority Data
Mar. 7, 2000 (JP) .......... 2000-067186

(51) Int. Cl.[7] .......... H05B 33/00
(52) U.S. Cl. .......... 313/504; 313/503; 428/690
(58) Field of Search .......... 313/498–512; 428/690

(56) References Cited

U.S. PATENT DOCUMENTS

| | | | |
|---|---|---|---|
| 5,336,546 A | * | 8/1994 | Hironaka et al. .......... 428/209 |
| 5,759,709 A | | 6/1998 | Doi et al. |
| 5,985,792 A | | 11/1999 | Miyadera et al. |
| 6,403,236 B1 | | 6/2002 | Ohnishi et al. |

* cited by examiner

Primary Examiner—Joseph Williams
(74) Attorney, Agent, or Firm—Young & Thompson

(57) ABSTRACT

A light emitting device capable of easily forming a fixed shape light emitting layer irrespective of the kind of light emitting materials is provided. The light emitting device includes a process of forming light emitting layers 5R, 5G, 5B by electrophotography, in the production method of a light emitting device in which the light emitting layers are composed of a material containing a polymer.

14 Claims, 3 Drawing Sheets

LIGHT EMITTING DEVICE HAVING A LIGHT EMITTING LAYER COMPOSED OF A MATERIAL CONTAINING A POLYMER

This application is a division of application Ser. No. 09/799,000, filed on Mar. 6, 2001, now U.S. Pat. No. 6,656,656, the entire contents of which are hereby incorporated by reference.

BACKGROUND OF THE INVENTION

1. Field of the Invention

The present invention relates to a production method of an electroluminescence light emitting device and the like, and specifically, relates to a production method of a light emitting device in case of using a material containing a polymer for a light emitting material.

2. Description of the Related Art

An organic EL (electroluminescence) light emitting material is largely divided into a low molecular weight type material practically used at present and a polymer type material which is promising in future development. Among these, when the low molecular weight type material is used, the film forming of a light emitting layer is usually carried out by a vacuum deposition method. In this case, the light emitting layer can be patterned by a method of piling up on a substrate a shadow mask in which an opening corresponding to a pixel is formed and depositing the material, therefore a fixed form corresponding to the pixel, for example, a dot form light emitting layer can be formed. Further, a light emitting layer having a plural number of light emitting colors in accordance with a fixed arrangement can be formed by repeating the above-mentioned processes by every respective light emitting colors.

Thus, when a low molecular weight type organic EL light emitting material is used, the light emitting layer can be patterned in a fixed form by the above-mentioned method. However, when a polymer type organic EL light emitting material is used, a vacuum deposition method cannot be used as a method of forming the film of the light emitting layer because the polymer type organic EL light emitting material is not deposited by heating but decomposed. Although a solution coating method such as spin-coating or dip-coating or the like can be used when the film of the polymer type organic EL light emitting material is formed, there are problems that it is difficult to partially form a coating film and it is difficult to form the light emitting layer in a fixed form.

SUMMARY OF THE INVENTION

The object of the present invention is to provide a light emitting device capable of easily forming a fixed form light emitting layer irrespective of the kind of light emitting materials, and a production method thereof.

To solve the problem, the light emitting device of the present invention is characterized in that light emitting layers are formed by electrophotography, in a light emitting device in which the light emitting layers are composed of a material containing a polymer.

According to the invention, since the light emitting layers is formed by electrophotography, the light emitting layers can be formed in a fixed form irrespective of the kind of light emitting materials of the light emitting layers. Further, the number of processes for formation of the light emitting layers can be reduced in comparison with a vacuum deposition method and the like.

To solve the problem, the light emitting device of the present invention is characterized in that light emitting layers are formed by a thermal transfer or sublimation method, in a light emitting device in which the light emitting layers are composed of a material containing a polymer.

According to the invention, since the light emitting layers are formed by a thermal transfer or sublimation method, the light emitting layers can be formed in a fixed form irrespective of the kind of light emitting materials of the light emitting layers. Further, the number of processes for formation of the light emitting layers can be reduced in comparison with a vacuum deposition method and the like.

To solve the problem, the production method of a light emitting device of the present invention is characterized in that a process of forming light emitting layers by electrophotography is included, wherein the light emitting layers are composed of a material containing a polymer.

According to the invention, since the light emitting layers are formed by electrophotography, the light emitting layers can be formed in a fixed form irrespective of the kind of light emitting materials of the light emitting layers. Further, the number of processes for formation of the light emitting layers can be reduced in comparison with a vacuum deposition method and the like.

The production method may include a process of forming the light emitting layers on a transfer member by electrophotography and a process of transferring the light emitting layers which were formed on the transfer member on the substrate of the light emitting device.

In this case, since the light emitting layers are transferred through the transfer member, the light emitting layers for various kind of the substrates can be formed by selecting the transfer member in accordance with the kind of the substrates. For example, when a member having elasticity is used as the transfer member, it comes to be able to be corresponded with a hard substrate composed of glass or the like.

To solve the problem, the production method of the light emitting device of the present invention is characterized in that a process of forming light emitting layers by a thermal transfer or sublimation method is included, wherein the light emitting layers are composed of a material containing a polymer.

According to the invention, since the light emitting layers are formed by a thermal transfer or sublimation method, the light emitting layers can be formed in a fixed form irrespective of the kind of light emitting materials of the light emitting layers. Further, the number of processes for formation of the light emitting layers can be reduced in comparison with a vacuum deposition method and the like.

The production method may include a process of forming the light emitting layers on a transfer member by a thermal transfer or sublimation method and a process of transferring the light emitting layers which were formed on the transfer member on the substrate of the emitting device.

The light emitting layers may contain at least one or more of light emitting materials emitting light by impressing electric field. In this case, the light emitting layers may be formed by dispersing not only those which are polymers such as a poly(p-phenylene vinylene) derivative, a polythiophene derivative, or a fluorene derivative, as they are, but also a low molecular weight light emitting material, in a polymer binder.

BRIEF DESCRIPTION OF THE DRAWING

FIG. 2A is a sectional view and FIG. 2B is a plan view viewed from the B—B line direction of FIG. 2A.

DETAILED DESCRIPTION OF THE PREFERRED EMBODIMENT

The First Embodiment

The first embodiment in which the production method of the light emitting device of the present invention was applied to the production of an electroluminescence panel, is illustrated below, referring to FIG. 1 to FIG. 3.

Figure 1:
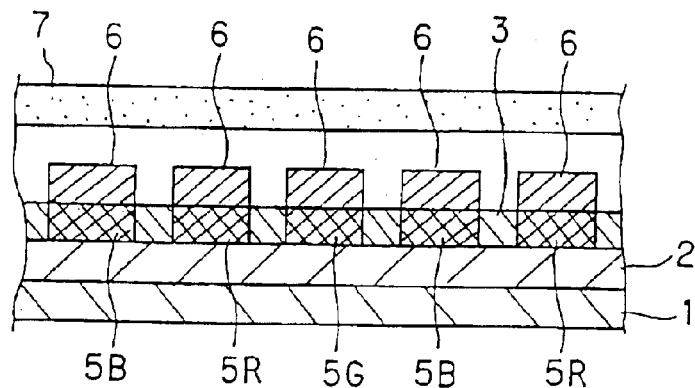
FIG. 1 is a sectional view of the electroluminescence panel produced by the production method of the present invention.
Figure 2A:
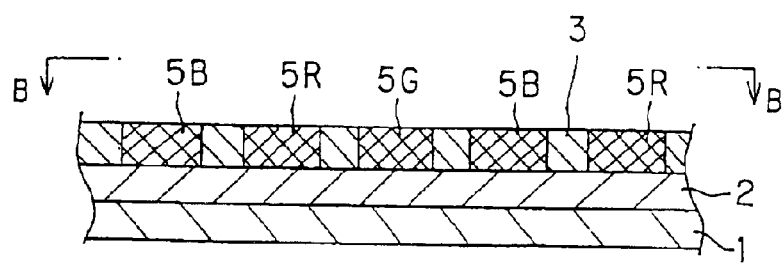
FIGS. 2A and 2B are sectional views showing the production process of the electroluminescence panel.
Figure 2B:
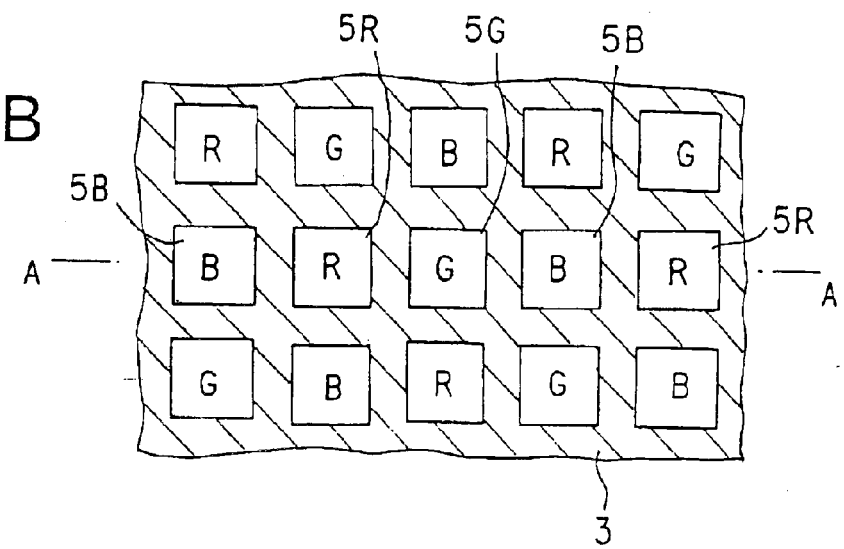

FIG. 1 is a sectional view of the electroluminescence panel produced by the production method of the present invention, FIG. 2A is a sectional view showing the production process of the electroluminescence panel of FIG. 1, and FIG. 2B is a plan view viewed from the B—B line direction of FIG. 2A.

As shown in FIG. 1 and FIG. 2, the electroluminescence panel 100 is provided with a transparent substrate 1, a plural number of positive electrodes 2 which are extended on the substrate 1 in a stripe shape to left and right directions of FIG. 1, an insulator layer 3 formed on the substrate 1 and the positive electrodes 2 in a lattice shape (refer to FIG. 2B), a hole transport layer not illustrated which exists between the positive electrodes 2 and the light emitting layers 5R, 5G, 5B, the light emitting layers 5R, 5G, 5B formed in a dot-matrix shape as surrounded by the insulator layer 3, a plural number of negative electrodes 6 which are formed in a stripe shape to a direction orthogonalized against the positive electrodes 2 at a position duplicated with the light emitting layers 5R, 5G, 5B, and a sealing glass 7 which seals the positive electrodes 2, the insulator layer 3, the hole transport layer, the light emitting layers 5R, 5G, 5B and the negative electrodes 6 between the substrate 1 and the sealing glass 7.

The positive electrodes 2 is composed of a transparent electro-conductive material such as ITO or the like, and the light emitting layer 5R emits red light, the light emitting layer 5G emits green light, and the light emitting layer 5B emits blue light, respectively, by impressing a fixed voltage between the positive electrodes 2 and the negative electrodes 6. The light emission of the light emitting layers 5R, 5G, 5B is confirmed by viewing from the substrate 1 side through the transparent positive electrodes 2 and the substrate 1.

Then, the production method of the electroluminescence panel 100 is illustrated.

Firstly, an electro-conductive film such as an ITO film or the like is formed on one plane of the substrate 1 using a spattering method or the like, then the film is patterned, then a plural number of positive electrodes 2 arranged in parallel at an fixed interval are formed.

Then, the insulator layer 3 is formed by electrophotography. FIG. 3 is a drawing schematically showing a device for forming the insulator layer 3. As shown in FIG. 3, the device 50 is provided with a photo conductor drum 51 for transferring a toner, a neutralizer 53 eliminating electrification of the surface of the photo conductor drum 51, an electrifying device 54 electrifying the surface of the photo conductor drum 51 at positive electric potential by generating corona discharge, an exposure device 55 radiating laser beam to the photo conductor drum 51, a developer 56 making the toner stick to the surface of the photo conductor drum 51, a transfer drum 57 provided in confrontation with the photo conductor drum 51, a fixing device 58 fixing the toner by adding heat and pressure to the toner transferred.

As the toner for forming the insulator layer 3, for example, those obtained by mixing those obtained by pulverizing a mixture of various kind of resins, various kind of waxes, various kind of electrification controllers, various kind of inorganic powders and the like, with carriers such as iron powder and the like, can be used. The toner is stored in the developer 56 of the device 50.

Figure 3:
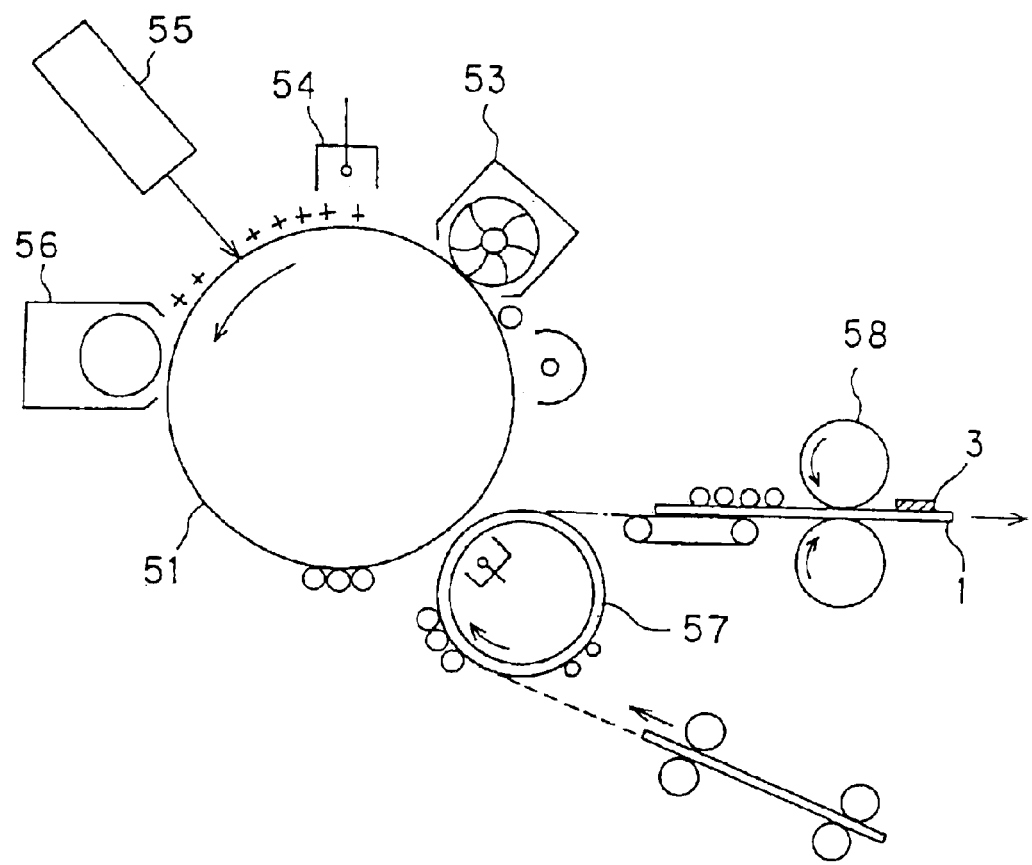
FIG. 3 is a drawing showing a device for forming the light emitting layer by electrophotography.

As shown in FIG. 3, the substrate 1 on which the positive electrodes 2 were formed is fed between the photo conductor drum 51 and the transfer drum 57.

After eliminating charge by the neutralizer 53, a lattice shape latent image corresponding to the shape of the insulator layer 3 is formed on the surface of the photo conductor drum 51 by scanning the surface of the photo conductor drum 51 which was electrified at positive electric potential by the corona electrifying device 54, with laser beam by the exposure device 55. Then, when the latent image formed on the surface of the photo conductor drum 51 is confronted with the developer 56, the toner is fed in like manner as the latent image and the lattice shape is developed on the surface of the photo conductor drum 51. Then, the toner on the photo conductor drum 51 is transferred on the substrate 1 at a position in confrontation with the transfer drum 57 while keeping the lattice shape, and then fixed on the substrate 1 by receiving heat and pressure caused by the fixing device 58. Thereby, the lattice shape insulator layer 3 is formed on the substrate 1.

Then, the light emitting layers 5R, 5G, 5B are respectively formed by electrophotography. In order to form the light emitting layers 5R, 5G, 5B, respective toners are made using the light emitting materials of corresponding colors. Specific example of the production method of the toner is described later.

Firstly, the toner of the light emitting layer 5R is stored in the developer 56 of the device 50. As shown in FIG. 3, the substrate 1 on which the positive electrodes 2 and the insulator layer 3 were formed is fed between the photo conductor drum 51 and the transfer drum 57.

After removing charge by the neutralizer 53, a dot shape latent image corresponding to the shape of the light emitting layer 5R is formed on the surface of the photo conductor drum 51 by scanning the surface of the photo conductor drum 51 which was electrified at positive electric potential by the corona electrifying device 54, with laser beam by the exposure device 55. Then, when the latent image formed on the surface of the photo conductor drum 51 is confronted with the developer 56, the toner is fed in like manner as the latent image and the dot shape corresponding to the shape of the light emitting layer 5R is developed on the surface of the photo conductor drum 51. Then, the toner on the photo conductor drum 51 is transferred on the substrate 1 at a position in confrontation with the transfer drum 57 while keeping the dot shape, and then fixed on the substrate 1 by receiving heat and pressure caused by the fixing device 58. Thereby, the dot shape light emitting layer 5R is formed on the substrate 1.

Further, using the toner for the light emitting layer 5G, the light emitting layer 5G is formed on the substrate 1 on which the light emitting layer 5R was formed, by the same process as in the light emitting layer 5R. Further, using the toner for the light emitting layer 5B, the light emitting layer 5B is formed on the substrate 1 on which the light emitting layer 5R and the light emitting layer 5G were formed, by the same process as in the light emitting layer 5R.

According to the above-mentioned processes, the light emitting layers 5R, 5G, 5B of three colors are formed in accordance with a fixed arrangement.

Specific example of the production method of the toner for forming the light emitting layers is shown below.

<Specific Example 1 of Production Method of Toner>

Firstly, 90 parts by weight of a poly(p-phenylene vinylene) derivative, 4 parts by weight of a polyethylene wax, and 2 parts by weight of an electrification controller are melted and kneaded to obtain a mixture. 0.5 Part by weight of hydrophobic silica is mixed with 100 parts by weight of a powder composition obtained by pulverizing and further classifying the mixture, and adjusted to be pulverized. Then, iron powder as a carrier is further added and mixed so as to have a powder concentration of 9% by weight to prepare a toner.

<Specific Example 2 of Production Method of Toner>

A toner can be prepared by the same process as in Specific Example 1 using a mixture obtained by melting and kneading 40 parts by weight of a poly(butyl acrylate), 50 parts by weight of a poly(p-phenylene vinylene) derivative, 4 parts by weight of a polyethylene wax, and 2 parts by weight of an electrification controller in place of the mixture of Specific Example 1.

<Specific Example 3 of Production Method of Toner>

A toner can be prepared by the same process as in Specific Example 1 using a mixture obtained by melting and kneading 100 parts by weight of a poly(butyl acrylate), 30 parts by weight of ALQ 3, 20 parts by weight of TPD, 5 parts by weight of a polyethylene wax, and 2.5 parts by weight of an electrification controller in place of the mixture of Specific Example 1.

Further, the constitution of the toner is not limited to those shown in the above-mentioned production methods. For example, a polythiophene derivative, a fluorene derivative and the like can be used in addition to a poly(p-phenylene vinylene) derivative as the light emitting materials. As shown in Specific Example 3 of the production method of the toner, a low molecular weight light emitting material can be added in a resin, and the resin in this case is not limited to a poly(butyl acrylate) resin. Other resins capable of being transferred, for example, such as an acryl resin, a vinyl chloride resin, a vinyl acetate resin, a polyester resin, a polyethylene resin and the like may be used.

Then, the negative electrodes 6 is formed by a vacuum deposition method. The stripe shape negative electrodes 6 composed of aluminum is formed by depositing aluminum by deposition on the insulator layer 3 and the light emitting layers 5R, 5G, 5B through a shadow mask in which an opening of a shape corresponding to the negative electrodes 6 was formed. Then, the seal glass 7 is installed and the electroluminescence panel 100 is produced.

In the present embodiment, since the light emitting layers 5R, 5G, 5B are formed by an electrophotography, the light emitting layers 5R, 5G, 5B can be easily formed in a fixed shape even if a polymer is contained in the light emitting layers 5R, 5G, 5B.

In the above-mentioned embodiment, the insulator layer 3 is formed using electrophotography, but the method of forming the insulator layer 3 is not limited, a photolithography technology may be used, and various printing technologies may be used.

An electron-injecting layer may be inserted between the light emitting layers and negative electrodes.

The Second Embodiment

Figure 4:
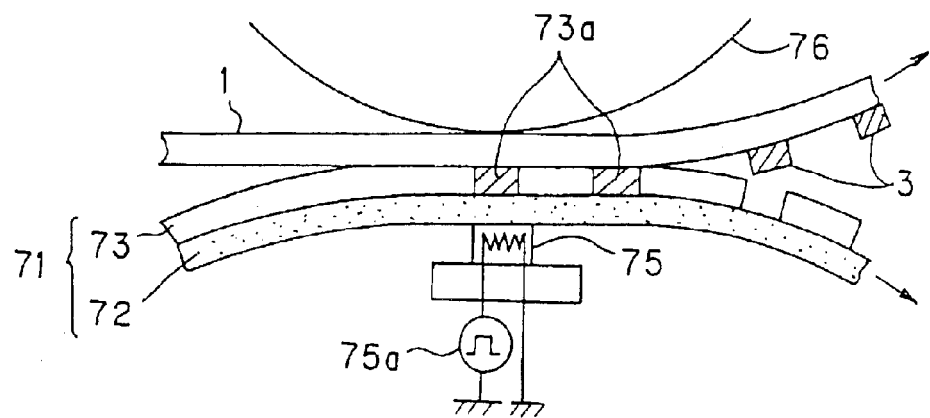
FIG. 4 is a drawing showing a forming method of the light emitting layer by a thermal transfer or sublimation method.

The second embodiment in which the production method of the light emitting device of the present invention is applied to the electroluminescence panel is illustrated referring to FIG. 4 below.

In the second embodiment, the light emitting layers 5R, 5G, 5B are formed using the a thermal transfer or sublimation method. FIG. 4 is a drawing showing the production method of the light emitting layer 5R. As shown in FIG. 4, a ribbon 71 is composed of a base film 72 and a transfer layer 73 which is coated on the surfaces of the base film 72 and supports a light emitting material. The transfer layer 73 is transferred on the substrate 1 by conveying the substrate 1 on which the transparent electrodes 2 are formed and the ribbon 71 between a thermal head 75 and a platen roll 76, pressuring them, and adding heat from the thermal head 75 to the ribbon 71 at a fixed timing, and the light emitting layer 5R is formed.

The thermal head 75 is provided with a plural number of heating elements which are arranged to a direction orthogonalized to the conveying direction of the substrate 1, and controlled by signals 75 impressed from outside. A portion of the transfer layer 73 is selectively melted and transferred on the substrate 1 by impressing fixed signals to the respective heating elements while conveying the substrate 1. Thereby, the light emitting layer 5R can be patterned to a fixed shape. Further, in FIG. 4, the fixed region of the transfer layer 73 which is scheduled to be transferred and form the light emitting layer 5R is shown as a region 73a.

The light emitting layers 5G, 5B are formed using the same process as in the light emitting layer 5R using ribbons supporting the respective light emitting materials.

Specific example of the production method of the ribbon 71 is illustrated below.

<Specific Example 1 of Production Method of Ribbon>

A poly(p-phenylene vinylene) derivative is dissolved in 1,2-dichlorobenzene, and a solution adjusted to have a concentration of about 5% by weight is prepared. The solution is coated on the surface of the base film 72 made of a polyethylene terephthlate using a wire bar, this is dried and the ribbon 71 is prepared.

<Specific Example 2 of Production Method of Ribbon>

A mixture of 40 parts by weight of a poly(butyl acrylate) and 50 parts by weight of a poly(p-phenylene vinylene) derivative is dissolved in 1,2-dichlorobenzene, and a solution adjusted to have a concentration of about 5% by weight is prepared. The solution is coated on the surface of the base film 72 made of a poly(ethylene terephthlate) using a wire bar, this is dried and the ribbon 71 is prepared.

<Specific Example 3 of Production Method of Ribbon>

A mixture of 100 parts by weight of a poly(butyl acrylate), 30 parts by weight of ALQ 3, and 20 parts by weight of TPD is dissolved in a mix solution of 1,2-dichlorobenzene/dichloro methylene, and a solution adjusted to have a concentration of about 5% by weight is prepared. The solution is coated on the surface of the base film 72 made of a poly(ethylene terephthlate) using a wire bar, this is dried and the ribbon 71 is prepared.

Further, the constitution of the ribbon 71 is not limited to those shown in the above-mentioned production methods. For example, as the base film 72, resin films such as a polyester film, a polyimide film and the like in addition to a poly(ethylene terephthalate) film, papers such as a condenser paper, a galssine paper and the like can be used. As the light emitting materials, a polythiophene derivative, a fluorene derivative and the like can be used in addition to a poly(p-phenylene vinylene) derivative. As shown in Specific Example 3 of the production method of the ribbon, a low molecular weight light emitting material can be added in a resin, and the resin in this case is not limited to a poly(butyl acrylate) resin. Other resins capable of being transferred, for example, such as a acryl resin, a vinyl chloride resin, a vinyl acetate resin, a polyester resin, a polyethylene resin and the like may be used.

In the present embodiment, since the light emitting layers 5R, 5G, 5B are formed by a thermal transfer or sublimation method, the light emitting layers 5R, 5G, 5B can be easily formed in a fixed shape even if a polymer is contained in the light emitting layers 5R, 5G, 5B.

The Third Embodiment

The third embodiment in which the production method of the light emitting device of the present invention was applied to the electroluminescence panel is illustrated below referring to FIG. 5.

Figure 5:
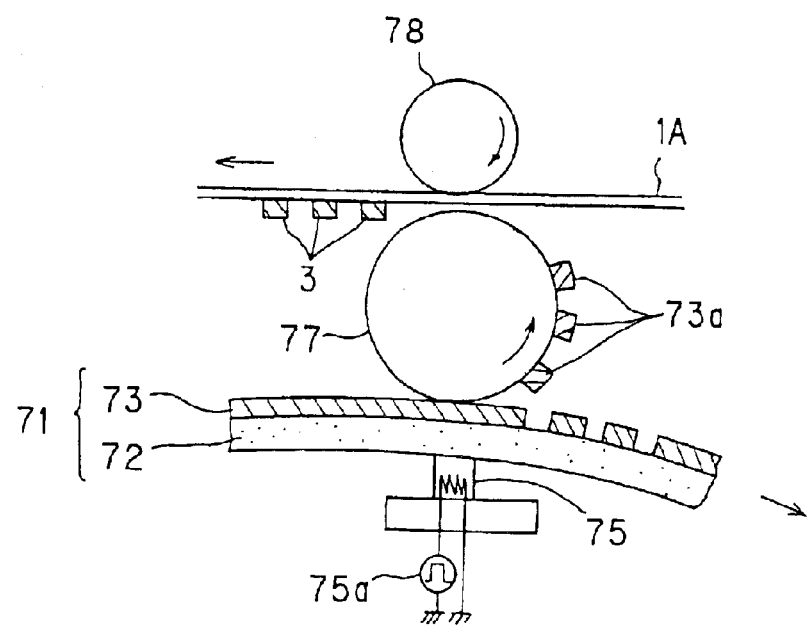
FIG. 5 is a drawing showing a method of forming the light emitting layer by transferring through an intermediate transfer roll.

As shown in FIG. 5, the ribbon 71 and the thermal head 75 being similar as in the second embodiment are used, but the transfer layer 73 of the ribbon 71 is not directly transferred on the substrate, and transferred on an intermediate transfer roll 77 having elasticity. The substrate 1A is conveyed while being sandwiched between the intermediate transfer roll 77 and the roll 78, and the fixed region 73a of the transfer layer 73 transferred on the intermediate transfer roll 77 is transferred again on the substrate 1A.

Thus, in the third embodiment, since the transfer layer 73 supporting the light emitting material is transferred on the substrate 1A through the intermediate roll 77, the transfer layer 73 can be transferred even if the substrate 1A has not elasticity, such as a case in which the substrate 1A is the substrate made of glass, etc.

In the third embodiment, although the transfer layer is transferred on the intermediate transfer roll by a thermal transfer or sublimation method, the transfer layer may be transferred on the intermediate transfer roll in a fixed shape using the electrophotography in place of the a thermal transfer or sublimation method, and the transfer layer on in intermediate transfer roll may be transferred again on the substrate.

The entire disclosure of Japanese Patent Application No.2000-67184 filed on Mar. 7, 2000 including the specification, claims, drawing and summary is incorporated herein by reference in its entirety.

What is claimed is:

1. A light emitting device in which a light emitting layer is composed of a material containing a polymer;
   wherein the light emitting layer is formed by electrophotography, and
   the material containing the polymer is a resin added to a toner which is used for the electrophotography.

2. A light emitting device in which a light emitting layer is composed of a material containing a polymer;
   wherein the light emitting layer is formed by a thermal transfer or sublimation method, and
   the light emitting layer is formed using a ribbon, which is used for the thermal transfer or sublimation method, supporting light emitting materials containing the material containing the polymer.

3. A light emitting device in the form of an electroluminescence panel, comprising:
   a transparent substrate (1);
   plural positive electrodes (2) extended on the substrate (1) in a stripe shape in a left to right direction;
   an insulator layer (3), the insulator layer being formed, in a lattice shape, on the positive electrodes 2;
   polymer-containing light emitting layers (5R, 5G, 5B) electrophotography-formed of a toner comprising a polymer-containing resin, the light emitting layers formed in a dot-matrix shape within and surrounded by the insulator layer (3);
   plural negative electrodes (6) formed in a stripe shape to a direction orthogonalized against the left to right direction of the positive electrodes (2) and at a position duplicated with the light emitting layers; and
   a sealing glass (7) sealing the positive electrodes, the insulator layer, the light emitting layers, and the negative electrodes between the substrate and the sealing glass.

4. The device of claim 3, wherein,
   the positive electrodes are composed of a transparent electro-conductive material,
   individual ones of the light emitting layers emitting red light, green light, and blue light, respectively, from impression of a fixed voltage between the positive electrodes and the negative electrodes,
   the light emission of the light emitting layers being viewed from the substrate side through the transparent positive electrodes and the substrate.

5. The device of claim 3, wherein the resin comprises a poly(p-phenylene vinylene) derivative, mixed with a polyethylene wax, and an electrification controller.

6. The device of claim 3, wherein the polymer is a poly(p-phenylene vinylene) derivative.

7. The device of claim 6, wherein the polymer further comprises a poly(butyl acrylate).

8. The device of claim 3, wherein the polymer comprises a poly(butyl acrylate).

9. The device of claim 3, wherein the polymer comprises one of a polythiophene derivative and a fluorene derivative.

10. A light emitting device according to claim 2, further comprising:
    a transparent substrate (1);
    plural positive electrodes (2) extended on the substrate (1) in a stripe shape from a left to right direction; and
    an insulator layer (3), the insulator layer being formed, in a lattice shape, on the positive electrodes (2);
    the light emitting layer being in the form of the ribbon (71) supporting polymer-containing light emitting layers (5R, 5G, 5B), the light emitting layers formed in a dot-matrix shape within and surrounded by the insulator layer (3), wherein,
    the ribbon (71) is composed of a base film (72) and a transfer layer (73) coated on the surfaces of the base film (72) and supporting the light emitting material,
    the transfer layer (73) being pressure transferred onto the substrate.

11. The device according to claim 10, wherein,
    the ribbon comprises a poly(butyl acrylate, and
    the base film comprises a poly(ethylene terephthlate).

12. The device according to claim 10, wherein,
    the base film is one of a polyester film, a polyimide film, and a poly(ethylene terephthalate) film.

13. The device according to claim 10, wherein,
    the base film is one of a condenser paper and a galssine paper.

14. The device according to claim 10, wherein, the light emitting material is one of a polythiophene derivative, a fluorene derivative and a poly(p-phenylene vinylene) derivative.

* * * * *